United States Patent
Wang et al.

(10) Patent No.: US 9,711,646 B2
(45) Date of Patent: Jul. 18, 2017

(54) SEMICONDUCTOR STRUCTURE AND MANUFACTURING METHOD FOR THE SAME

(71) Applicant: United Microelectronics Corp., Hsinchu (TW)

(72) Inventors: Yu-Ping Wang, Taoyuan County (TW); Jyh-Shyang Jenq, Tainan (TW); Yu-Hsiang Lin, New Taipei (TW); Hsuan-Hsu Chen, Tainan (TW); Chien-Hao Chen, Tainan (TW); Yi-Han Ye, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 304 days.

(21) Appl. No.: 14/230,223

(22) Filed: Mar. 31, 2014

(65) Prior Publication Data
US 2015/0279957 A1    Oct. 1, 2015

(51) Int. Cl.
*H01L 29/78*    (2006.01)
*H01L 29/66*    (2006.01)

(52) U.S. Cl.
CPC ...... *H01L 29/785* (2013.01); *H01L 29/66795* (2013.01)

(58) Field of Classification Search
CPC .................................................. H01L 27/0251
See application file for complete search history.

(56) References Cited

U.S. PATENT DOCUMENTS

| | | | |
|---|---|---|---|
| 7,115,974 B2 | 10/2006 | Wu et al. | |
| 8,436,404 B2 | 5/2013 | Bohr et al. | |
| 8,440,533 B2 | 5/2013 | Toh et al. | |
| 8,450,178 B2 | 5/2013 | Cheng et al. | |
| 8,809,173 B1* | 8/2014 | Yin | H01L 29/0684 257/288 |
| 8,846,489 B2* | 9/2014 | Lin | H01L 21/76205 438/424 |
| 2003/0234419 A1* | 12/2003 | Lin | H01L 21/823425 257/314 |
| 2008/0258225 A1* | 10/2008 | Yang | H01L 21/28114 257/364 |
| 2012/0139062 A1* | 6/2012 | Yuan | H01L 21/76897 257/411 |
| 2013/0109152 A1 | 5/2013 | Huang et al. | |
| 2013/0295755 A1 | 11/2013 | Chang | |

OTHER PUBLICATIONS

Britten, J. A., et al. "Etch—stop characteristics of Sc2O3 and HfO2 films for multilayer dielectric grating applications.", Jun. 1996, Journal of Vacuum Science & Technology A 14.5.

* cited by examiner

*Primary Examiner* — Mohammad Choudhry
(74) *Attorney, Agent, or Firm* — WPAT, PC

(57) ABSTRACT

A semiconductor structure and a manufacturing method for the same are disclosed. The semiconductor structure includes a first gate structure, a second gate structure and a second dielectric spacer. Each of the first gate structure and the second gate structure adjacent to each other includes a first dielectric spacer. The second dielectric spacer is on one of opposing sidewalls of the first gate structure and without being disposed on the dielectric spacer of the second gate structure.

18 Claims, 3 Drawing Sheets

SEMICONDUCTOR STRUCTURE AND MANUFACTURING METHOD FOR THE SAME

BACKGROUND

Technical Field

The disclosure relates to a semiconductor structure and a manufacturing method for the same, and more particularly to a MOS and a manufacturing method for the same.

Description of the Related Art

For forming a designed integrated circuit to a semiconductor wafer, a mask formed with a design layout pattern is provided. The layout pattern defined by the photomask is transferred on to a photoresist layer on a surface of a semiconductor structure and then transferred into the semiconductor structure by photolithography processes. Therefore, the photolithography process is an important key for the semiconductor manufacturing.

The critical dimension (CD) of the pattern for the photomask is limited to the resolution limit of the optical exposure tool. With the trend towards high integration and small pattern of the circuit design, the deviation or the distortion of the pattern transferred into the semiconductor structure occur more easily due to the optical proximity effect (OPE) during exposing the photomask having high pattern density. The electrical characteristic of the device is affected by the distortion.

SUMMARY

According to one embodiment, a semiconductor structure is disclosed, comprising a first gate structure, a second gate structure and a second dielectric spacer. Each of the first gate structure and the second gate structure adjacent to each other comprises a first dielectric spacer. The second dielectric spacer is on one of opposing sidewalls of the first gate structure and without being disposed on the dielectric spacer of the second gate structure.

According to another embodiment, a manufacturing method is disclosed, comprising following steps. A first gate structure and a second gate structure adjacent to the first gate structure are formed. Each of the first gate structure and the second gate structures comprises a first dielectric spacer. A second dielectric spacer is formed on the first dielectric spacer on one of opposing sidewalls of the first gate structure and without being disposed on the first dielectric spacer of the second gate structure.

DETAILED DESCRIPTION

FIG. 1 to FIG. 4 illustrate a manufacturing method for a semiconductor structure.

Figure 1:
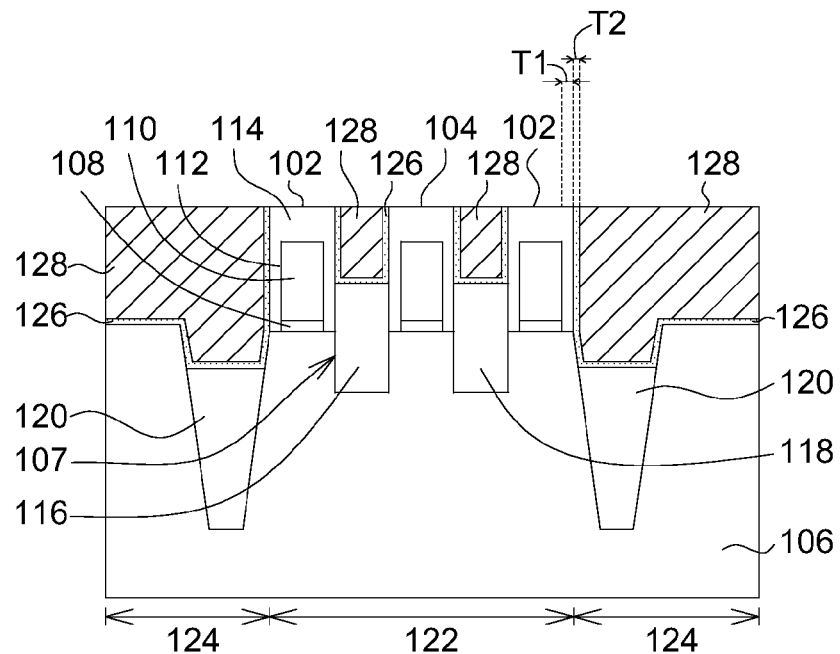
FIG. 1 to FIG. 4 illustrate a manufacturing method for a semiconductor structure.

Referring to FIG. 1, a first gate structure 102 and a second gate structure 104 are formed on a semiconductor substrate 106. For example, the semiconductor substrate 106 may be but not limited to a silicon substrate, and may be selected as other suitable substrate structures, such as a SOI structure, etc. Each of the first gate structure 102 and the second gate structure 104 comprises a gate dielectric 108 formed on the semiconductor substrate 106, a gate electrode 110 formed on the gate dielectric 108, and a first dielectric spacer 112 formed on the gate electrode 110.

In one embodiment, the first gate structure 102 and the second gate structure 104 are high-k metal gates, that is the gate dielectric 108 is a high-k material and the gate electrode 110 is a metal material. The gate dielectric 108 is not limited to a flat shape film as shown in FIG. 1 that may be formed by a gate-first process, and may be a U shape film with the gate electrode 110 embedded therein that may be formed by a gate-last process. The high-k material may comprise hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, etc. The metal material for the gate electrode 110 may be a P-type work function metal or an N-type work function metal. For example, the P-type work function metal may comprise ruthenium, palladium, platinum, cobalt, nickel, and conductive metal oxides, e.g., ruthenium oxide. The N-type work function metal may comprise hafnium, zirconium, titanium, tantalum, aluminum, alloys of these metals, and carbides of these metals such as hafnium carbide, zirconium carbide, titanium carbide, tantalum carbide, or aluminum carbide, etc.

The first gate structure 102 and the second gate structure 104 may comprise a cap layer 114 formed on an upper surface of the gate electrode 110. The first dielectric spacer 112 and the cap layer 114 may be, but not limited to the same material, such as a low-k, of for example equal to or smaller than 7, material such as a nitride ($Si_xN_y$, such as SiN, $Si_3N_4$, or SiCN, SiON, SiCNO, etc).

A source/drain 116 (such as a source) and a source/drain 118 (such as a drain) are disposed on the semiconductor substrate 106 on opposing sides of the second gate structure 104 respectively. The source/drain 116 and the source/drain 118 have conductivities opposite to a conductivity type of the semiconductor substrate 106. For example, the source/drain 116, 118 may be formed on the semiconductor substrate 106 by an in-situ doping epitaxial or deposition method in a region where a recess 107 is etched into the semiconductor substrate 106. In other embodiments, the source/drain 116, 118 may be formed in the semiconductor substrate 106 by a doping method using the first gate structure 102 and the second gate structure 104 as a mask.

An isolation structure 120 is not limited to a trench structure formed in the semiconductor substrate 106 as shown in FIG. 1, such as a shallow trench or a deep trench, and may be formed on the semiconductor substrate 106 by a FOX process, or use other suitable insulating structures, or a doped structure having a conductivity type opposite to the conductivity type of the semiconductor substrate 106.

The isolation structure 120 may be used for isolating the first gate structure 102 and the second gate structure 104 from other semiconductor devices. For example, a region between inner sidewalls of the isolation structure 120 may be defined as an active region 122. A region where the isolation structure 120 is located therein and a region outside of the isolation structure 120 can be defined as an outside region 124 outside of the active region 122. For example, the outside region 124 may comprise an isolation region, non-active region, and/or active regions of other semiconductor devices, etc. The first gate structure 102 may be functioned as a dummy gate structure.

A second dielectric spacer 126 is formed in the active region 122 and the outside region 124. For example, the second dielectric spacer 126 may be conformally formed on the source/drain 116, 118 and the first dielectric spacer 112, and may be formed on the semiconductor substrate 106, the isolation structure 120, or on the cap layer 114 (not shown). A thickness T1 of the first dielectric spacer 112 is larger than a thickness T2 of the second dielectric spacer 126. The thickness of T2 of the second dielectric spacer 126 may be smaller than 5 nm. In embodiments, the second dielectric spacer 126 is a metal oxide or high-k (such as bigger than 7) material. In one embodiment, the second dielectric spacer 126 and the gate dielectric 108 are the same material such as hafnium oxide (HfO$_2$, of dielectric constant k of 25). In other embodiments, other materials may be used for the second dielectric spacer 126, such as an aluminum oxide (Al$_2$O$_3$, of dielectric constant k of 9), a yttrium oxide (Y$_2$O$_3$, of dielectric constant k of 15), a tantalum oxide (Ta$_2$O$_5$, of dielectric constant k of 22), a titanium oxide (TiO$_2$, of dielectric constant k of 80), a lanthanum oxide (La$_2$O$_3$, of dielectric constant k of 30), a-LaAlO$_3$ of dielectric constant k of 30, a strontium titanium oxide (SrTiO$_3$, of dielectric constant k of 2000), a zirconium oxide (ZrO$_2$, of dielectric constant k of 25), hafnium silicon oxide (HfSiO$_4$, of dielectric constant k of 11).

A dielectric layer 128 (such as an inter-layer dielectric layer ILD0) is formed on the second dielectric spacer 126. The dielectric layer 128 may be a low-k dielectric material comprising an oxide such as silicon dioxide (SiO$_2$), carbon doped oxide (CDO), silicon nitride, organic polymers such as perfluorocyclobutane or polytetrafluoroethylene, fluorosilicate glass (FSG), or organosilicates such as silsesquioxane, siloxane, or organosilicate glass. After the second dielectric spacer 126 and the dielectric layer 128 are formed, a planarization step such as a CMP process may be performed, which may be controlled to stop on the cap layer 114, or on the films such as the material layer or the dielectric layer (not shown) on the cap layer 114, properly.

Figure 2A:
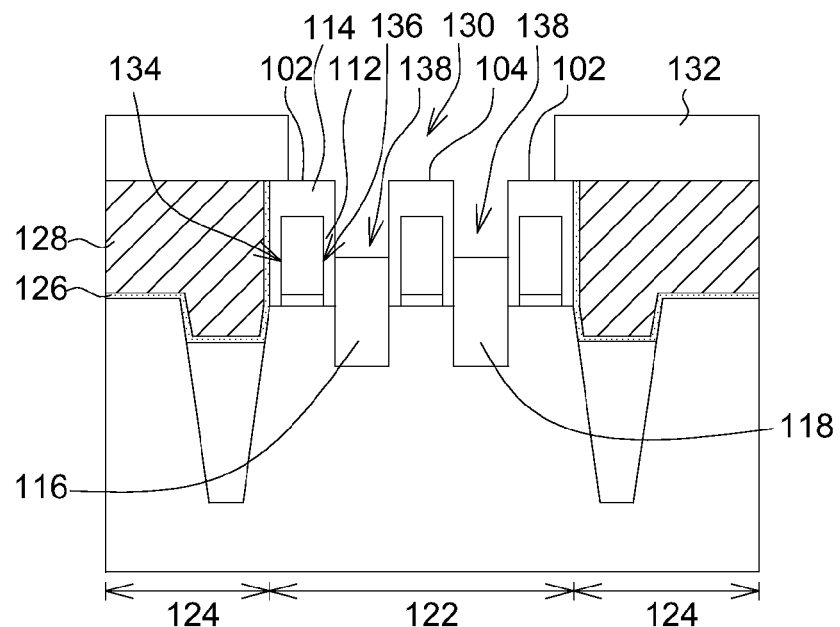
Figure 2B:
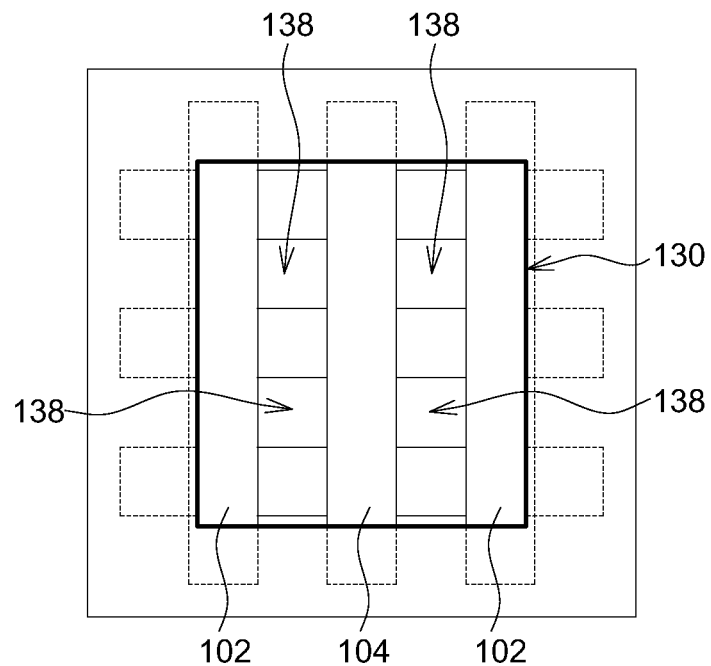

Referring to FIG. 2A and FIG. 2B which shows a top view of partial elements of the semiconductor structure shown in FIG. 2A according to one embodiment, a mask layer 132 having an opening 130 is formed. In embodiments, the opening 130 of the mask layer 132 is formed by a lithography, etching process using only one photomask to pattern the mask layer 132. The mask layer 132 may comprise a photoresist material or other suitable materials.

An etching process is performed to remove the dielectric layer 128 (FIG. 1) exposed by the opening 130. In embodiments, compared to the second dielectric spacer 126, this etching process has a higher etching selectivity to the dielectric layer 128, that is, the etching process etches the dielectric layer 128 faster than the second dielectric spacer 126, or etches substantially none of the second dielectric spacer 126 (the similar concepts will not described hereafter), and by which the second dielectric spacer 126 in the active region 122 can be remained while the dielectric layer 128 is removed. Portions coved by the mask layer 132, such as the dielectric layer 128 in the outside region 124, are not removed. Conditions of the etching process may be selected according to the materials of the dielectric layer 128 and the second dielectric spacer 126. The etching process may comprise any suitable method such as a dry etching, a wet etching, etc, or a combination thereof.

Then, another etching process is performed to remove the second dielectric spacer 126 (FIG. 1) exposed by the opening 130 between the first gate structure 102 and the second gate structure 104. This etching process etches the second dielectric spacer 126 at an etching rate fast than an etching rate to the first dielectric spacer 112 and the cap layer 114, and by which first dielectric spacer 112 and the cap layer 114 can be remained while the second dielectric spacer 126 is removed. Portions coved by the mask layer 132, such as the second dielectric spacer 126 on a sidewall 134 and the isolation structure 120 adjacent to the sidewall 134 in the outside region 124, are not removed. Conditions of this etching process may be selected according to the materials of the second dielectric spacer 126 and the first dielectric spacer 112, cap layer 114. The etching process may comprise any suitable method such as a dry etching, a wet etching, etc, or a combination thereof. In one embodiment, for example, the etching process for removing the second dielectric spacer 126 of metal oxide uses a SC1 clean process performed with a water solution of aqueous ammonium hydroxide (NH$_4$OH) and hydrogen peroxide (H$_2$O$_2$). Etching chemistry or etching solution for removing the dielectric layer 128 may be different from that for removing the second dielectric spacer 126.

In one embodiment, after the dielectric layer 128 and the second dielectric spacer 126 (FIG. 1) in the active region 122 are removed, the second dielectric spacer 126 and the dielectric layer 128 are remained only on the sidewall 134 facing the outside region 124 of the sidewall 134 and a sidewall 136 of the first gate structure 102, and not remained on the first dielectric spacer 112 of the second gate structure 104 and the sidewall 136 facing the second gate structure 104 of the first gate structure 102.

An empty space 138 defined by the first dielectric spacers 112 of the first gate structure 102 and the second gate structure 104 and an upper surface of the source/drain 116, 118 is generated by removing the dielectric layer 128 and the second dielectric spacer 126 (FIG. 1) in the active region 122. Since the empty space 138 is formed by a self-aligning method directly using the first gate structure 102 and the second gate structure 104, the single opening 130 of the mask layer 132 can be designed to have a big size to expose a region where a plurality of empty spaces 138 is or to be formed at the same time. The big size of the opening 130 indicates the single photomask for defining the opening 130 can be designed to have a big feature size correspondingly. The photomask having a bigger feature size is cheaper than a photomask having a smaller feature size. Therefore, according to embodiments, the empty spaces 138 can be formed by the manufacturing method of low cost. The empty space 138 is defined by the first gate structure 102 and the second gate structure 104, and thus can be formed or designed to have a fine size such as a width. As long as the desired empty space 138 can be formed, the opening 130 (or the photomask) can bear with some degree of alignment shift to avoid decreasing yield due to a process shift issue. In some embodiments, the empty space 138 may be formed without using multi-lithography process such as a double-lithography process, a triple-lithography process, etc. Therefore, the manufacturing method is simple and fast.

Figure 3:
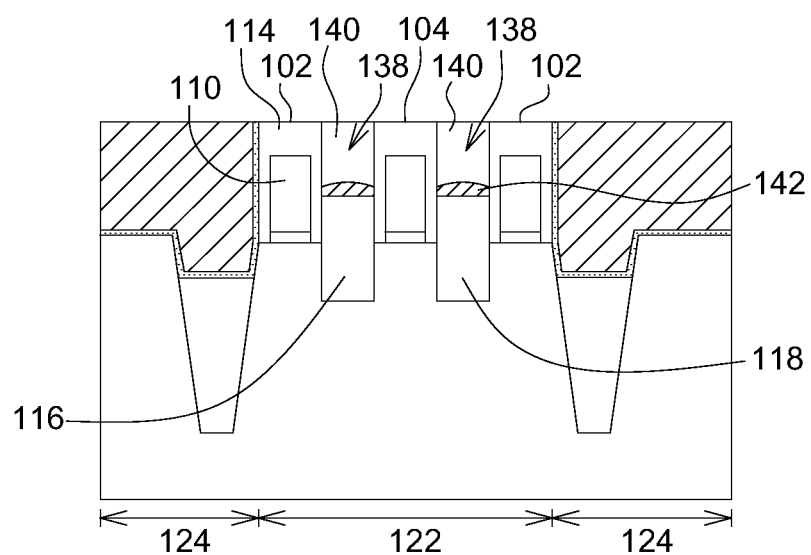

Referring to FIG. 3, a conductive contact 140 is formed by filling the empty space 138 with a conductive material. A planarization step such as a CMP process may be performed to the conductive material, which can be controlled to stop on the cap layer 114 properly. As mentioned above, empty space 138 for forming the conductive contact 140 is self-aligned on the source/drain 116, 118 between the first gate structure 102 and the second gate structure 104, and therefore the formed conductive contact 140 can be have an electrical connect with the source/drain 116, 118 as desired, and is not mislanded on the gate electrode 110 to avoid an undesired circuit or short which would cause a problem of decreasing yield of a product. The conductive material is not limited to a metal such as Au, W, etc, and may comprise other materials having good conductivity characteristic properly. In some embodiments, an optional metal silicide 142 may be formed on the source/drain 116 118 by a salicide process.

Figure 4:
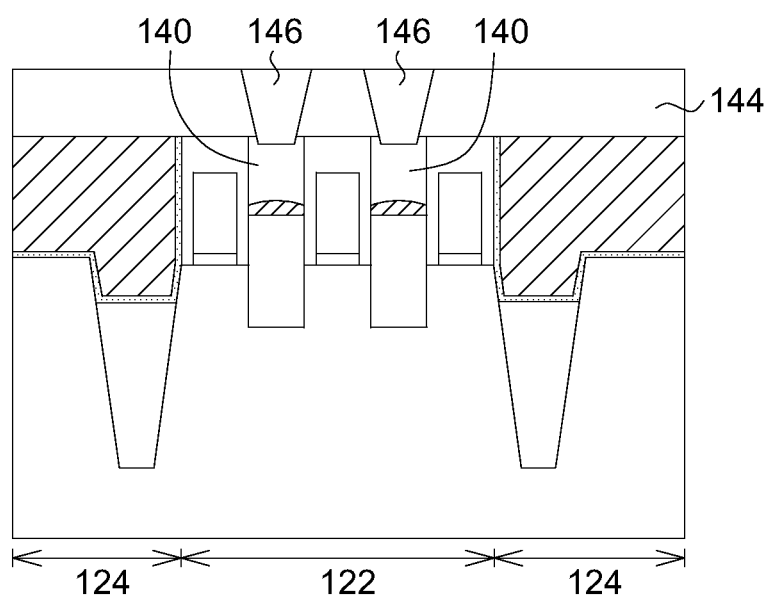

Referring to FIG. 4, a dielectric layer 144 (such as an inter-layer dielectric layer ILD1) is formed, and a conductive element such as a conductive plug 146 is formed in the dielectric layer 144 to form an electrical connection with the conductive contact 140. The dielectric layer 144 may comprise an oxide such as silicon dioxide ($SiO_2$), or carbon doped oxide (CDO), silicon nitride, organic polymers such as perfluorocyclobutane or polytetrafluoroethylene, fluorosilicate glass (FSG), or organosilicates such as silsesquioxane, siloxane, or organosilicate glass. The conductive plug 146 is not limited to a metal such as Au, W, etc, and may comprise other materials having good conductivity characteristic properly. In one embodiment, the semiconductor structure is a fin field-effect transistor (FinFET).

The various materials disclosed in embodiments may be formed by any suitable method such as a CVD method, a PVD method, an ALD method, etc.

The concepts of the manufacturing method according to embodiments can be applied to various kinds of semiconductor structures, such as MOS, DRAM, SRAM, logic, PRM, etc, or may be applied to products of small feature size such as 14 nm or smaller generation.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a semiconductor substrate;
   an isolation structure;
   a first gate structure and a second gate structure adjacent to the first gate structure, each of the first gate structure and the second gate structures comprising a first dielectric spacer; and
   a second dielectric spacer having a conformal shape and continuously extending on the first dielectric spacer on only one of opposing sidewalls of the first gate structure, a sidewall of the semiconductor substrate below the first dielectric spacer and the isolation structure below the sidewall of the semiconductor substrate, and without being disposed on the first dielectric spacer of the second gate structure.

2. The semiconductor structure according to claim 1, wherein the first dielectric spacer is thicker than the second dielectric spacer.

3. The semiconductor structure according to claim 1, wherein the first dielectric spacer is a nitride comprising SiN, SiCN, SiCNO, or SiON.

4. The semiconductor structure according to claim 1, wherein the second dielectric spacer is a metal oxide or high k material.

5. The semiconductor structure according to claim 1, wherein each of the first gate structure and the second gate structure comprises a gate dielectric and a gate electrode on the gate dielectric, the gate dielectric is a high-k material, the gate electrode is a metal material.

6. The semiconductor structure according to claim 5, wherein the gate dielectric and the second dielectric spacer are the same material.

7. The semiconductor structure according to claim 5, wherein each of the first gate structure and the second gate structure further comprises a cap layer on an upper surface of the gate electrode.

8. The semiconductor structure according to claim 1, which is a fin field-effect transistor.

9. A manufacturing method, comprising:
   forming an isolation structure in a semiconductor substrate;
   forming a first gate structure and a second gate structure adjacent to the first gate structure on the semiconductor substrate, each of the first gate structure and the second gate structures comprising a first dielectric spacer; and
   forming a second dielectric spacer having a conformal shape and continuously extending on the first dielectric spacer on only one of opposing sidewalls of the first gate structure, a sidewall of the semiconductor substrate below the first dielectric spacer and the isolation structure below the sidewall of the semiconductor substrate, and without being disposed on the first dielectric spacer of the second gate structure.

10. The manufacturing method according to claim 9, wherein the first dielectric spacer is thicker than the second dielectric spacer.

11. The manufacturing method according to claim 9, wherein each of the first gate structure and the second gate structure comprises a gate dielectric and a gate electrode on the gate dielectric, the gate dielectric is a high-k material, the gate electrode is a metal material.

12. The manufacturing method according to claim 11, wherein the gate dielectric and the second dielectric spacer are the same material.

13. The manufacturing method according to claim 11, wherein each of the first gate structure and the second gate structure further comprises a cap layer formed on an upper surface of the gate electrode.

14. The manufacturing method according to claim 9, which is for forming a fin field-effect transistor.

15. The semiconductor structure according to claim 1, comprising two the first gate structure, wherein the second gate structure is between the two first gate structures, the second dielectric spacer is not disposed on the first dielectric spacer on both of opposing sidewalls of the second gate structure.

16. The semiconductor structure according to claim 1, further comprising a source/drain shared by the first gate structure and the second gate structure, wherein the second dielectric spacer is not disposed on the first dielectric spacer on both of opposing sidewalls of the second gate structure.

17. The semiconductor structure according to claim 1, wherein the sidewall of the semiconductor substrate is between a top surface of the isolation structure and an interface of the semiconductor substrate and the first dielectric spacer.

18. The semiconductor structure according to claim 17, wherein the second dielectric spacer is directly on the sidewall of the semiconductor substrate and the top surface of the isolation structure.

* * * * *